United States Patent [19]

Kang et al.

[11] Patent Number: 5,196,363
[45] Date of Patent: Mar. 23, 1993

[54] METHOD OF FORMING MIST TYPE DYNAMIC RANDOM ACCESS MEMORY CELL

[75] Inventors: Youngtae Kang; Laeku Kang, both of Seoul, Rep. of Korea

[73] Assignee: Samsung Electronics Co., Ltd., Suwon, Rep. of Korea

[21] Appl. No.: 635,728

[22] Filed: Dec. 28, 1990

[30] Foreign Application Priority Data

Nov. 10, 1990 [KR] Rep. of Korea ............... 90-16121

[51] Int. Cl.$^5$ ............................................. H01L 21/70
[52] U.S. Cl. .................................... 437/52; 437/47; 437/48; 437/60; 437/203; 437/919
[58] Field of Search ............... 437/38, 47, 48, 52, 437/60, 191, 193, 195, 203, 228, 233, 235; 357/23.6, 51; 156/643

[56] References Cited

U.S. PATENT DOCUMENTS

| | | | |
|---|---|---|---|
| 4,860,071 | 8/1989 | Sunami et al. | 357/23.6 |
| 4,912,535 | 3/1990 | Okumura | 357/23.6 |
| 4,951,175 | 8/1990 | Kurosawa et al. | 437/52 |
| 5,011,788 | 4/1991 | Kawaji et al. | 437/67 |
| 5,066,608 | 11/1991 | Kim et al. | 437/52 |
| 5,077,232 | 12/1991 | Kim et al. | 437/52 |

FOREIGN PATENT DOCUMENTS

| | | |
|---|---|---|
| 204144 | 12/1982 | Japan . |
| 0225863 | 10/1986 | Japan . |
| 0123764 | 6/1987 | Japan . |
| 62-179759 | 8/1987 | Japan . |
| 63-239969 | 10/1988 | Japan . |
| 0284850 | 11/1988 | Japan . |
| 0081472 | 3/1990 | Japan . |
| 2-106958 | 4/1990 | Japan . |
| 0116160 | 4/1990 | Japan . |

OTHER PUBLICATIONS

Watanabe et al., "Stacked Compacitor Cells for High Density Dynamic RAMs", IEDM 88, pp. 600-603.
S. Inoue et al., "A Spread Stacked Capacitor (SSC) Cell for 64 Mbit DRAMs", IEDM, 1989, pp. 31-34.

Primary Examiner—Tom Thomas
Attorney, Agent, or Firm—Christie, Parker & Hale

[57] ABSTRACT

A dynamic random access memory cell having a mixed trenched stacked capacitor, and a formation process thereof are disclosed. According to the present invention, the punch-through phenomenon is prevented by providing a difference between the trench depths of the trenched capacitors. Further, the insufficient capacitance of the capacitor having a shallower trench is compensated by making the area of the electrode of the stacked capacitor larger than the area of the electrode of the stacked capacitor of the memory cell having a deeper trenched capacitor. Thus, the coupling phenomenon liable to occur between the stacked capacitors can be prevented, thereby providing a DRAM cell applicable to ultra large scale integrated circuit.

4 Claims, 4 Drawing Sheets

FIG. 2 first memory cell
second memory cell

METHOD OF FORMING MIST TYPE DYNAMIC RANDOM ACCESS MEMORY CELL

BACKGROUND OF THE INVENTION (1) Field of the Invention

The present invention relates to a dynamic random access memory cell and a formation process thereof, and more particularly to a dynamic random access memory cell and a formation process thereof, in which a mixed stacked trench (MIST) type capacitor is provided.

(2) Description of the Prior Art

In the technical field of the semiconductor memories, efforts have been focused on increasing the number of memory cells. For this purpose, it is important to minimize the area of each cell of the memory cell array formed on a chip which has a limited area.

Thus, it is well known that providing one transistor and one capacitor in a memory cell in the smallest possible area is desirable. However, in a 1-transistor/1-capacitor cell, the capacitor occupies the most part of the area. Therefore, it is important that the area occupied by the capacitor is minimized, and at the same time, the capacitance of the capacitor is maximized, thereby making it possible to detect the stored data with a great reliability, and reducing the soft errors due to alpha particles.

In minimizing the occupation area of the capacitor and in maximizing the capacitance, a trench type capacitor is proposed, and this trench type capacitor is constituted such that a cylindrical well is formed on the surface of the chip, and the capacitor electrode consists of the wall of the cylindrical well. Such a conventional trench type capacitor is disclosed in IEDM85(pp 710–713, 1985).

This trench type capacitor is formed in the following manner. That is, a wafer in which a p epitaxial layer is grown on a high concentration P+ substrate is used, and a cylindrical well is formed into the high concentration P+ layer. Then an insulating layer is formed on the wall of the well, and an n+ polysilicon is filled into it, while a connection is formed to the source region of the transistor thereafter.

However, in forming the above described trench type capacitor, the thickness of the epitaxial layer is several micrometers, and therefore, the depth of the trench has to be deep enough to obtain a proper value of the capacitance, i.e., a value of capacitance suitable for the operation of the DRAM cell. Further, a thin oxide layer is formed on the wall of the trench, but, due to the sharpness of the corners of the bottom of the trench, the insulating layer can be damaged by the voltage supplied to the polysilicon which is filled into the trench for serving as the electrode of the capacitor. Further, when the voltage on the polysilicon layer is varied, a strong inversion layer is formed between the above mentioned low concentration layer and the surface of the wall, thereby causing a punch-through phenomenon on the adjacent capacitors.

Another technique for maximizing the capacitance with the limited memory cell is proposed, and this technique is disclosed in pages 31 through 34 of IEDM (International Electron Devices Meeting) (S. Inoue et al.) of 1989. This is a DRAM cell using a stacked capacitor (STC), and the description also includes a spread stacked capacitor (SSC) which is an improvement over the stacked capacitor.

Figure 3:
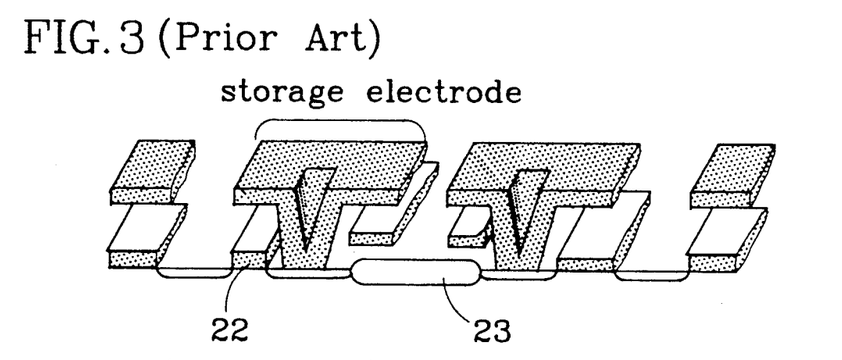
FIGS. 3 and 4 are partly sectional perspective views of the prior art, in particular, a DRAM cell having a conventional stacked capacitor and a conventional spread stacked capacitor, respectively, in which $SiO_2$ is removed.
Figure 4:
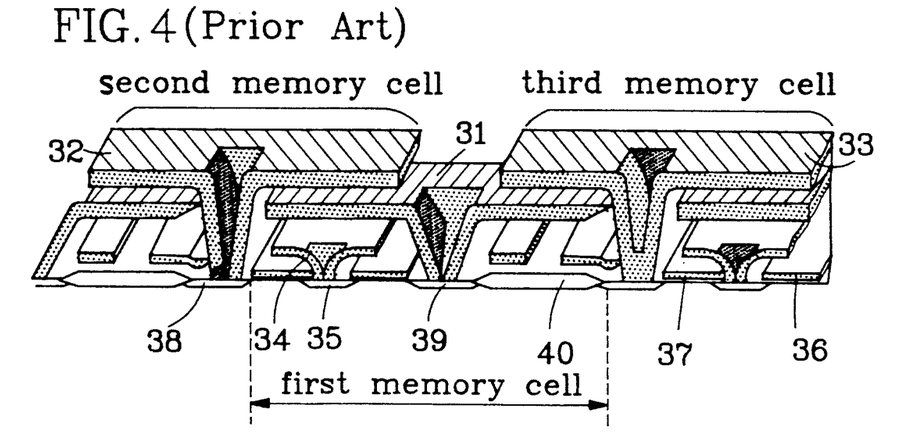

The above conventional techniques will be further described referring to FIGS. 3 and 4. FIG. 3 is a sectional view of a DRAM cell having a stacked capacitor, and in this DRAM cell, SiO$_2$ is eliminated in order to simplify the structure of the memory cell. Here, reference code 21 indicates a storage electrode, 22 a word line, and 23 a field oxide layer.

As shown in the drawing, the storage electrode 21 of this DRAM cell uses only its own one memory cell region, and therefore, it can not provide a sufficient storage capacitance within its limited own cell region for a memory device having a large capacity of over 16M bits.

FIG. 4 illustrates a structure in which each of storage electrodes 31, 32, 33 occupies two memory cell regions, thereby doubling the storage capacitance of the STC type memory cell of FIG. 3. In FIG. 4, reference code 31 indicates a storage electrode of a first memory cell; 32 a storage electrode of a second memory cell; 33 a storage electrode of a third memory cell; 34 a bit line; 35 a common drain region; 36 and 37 word lines to serve as the gate electrodes; 38 and 39 source electrodes, and 40 a field oxide layer.

As shown in FIG. 4, the two memory cells, i.e., the first and second memory cells are formed between the field oxide layer 40 and another field oxide layer 40. The spread stacked storage electrode 31 of the first memory cell is formed in such a manner that, in the vertical direction, it is extended between the bit line 34 and the storage electrode 32 of the second memory cell, and in the lengthwise direction, it is extended over a length equivalent to the two memory cell regions formed between the second storage electrode 32 and the third storage electrode 33.

Accordingly, the storage capacitance Cs is greatly increased because it is proportionate to the area, but the distance between the first storage electrode 31 and the second storage electrode 32 and the third storage electrode 33 becomes too close, thereby causing the coupling of the electrodes too close, and consequently, causing disturbances in the stack structure.

SUMMARY OF THE INVENTION

The present invention is intended to overcome the above-described disadvantages of the conventional techniques. That is, the present invention is intended to overcome the problems of the punch-through phenomenon and the coupling phenomenon respectively occurring in the trenched capacitor and the stacked capacitor.

The intersections between electrodes have to be reduced as far as possible if the coupling phenomenon between the storage electrodes is to be reduced. Further, the step difference has to be reduced, and the trench type has to be used if the intersections between electrodes are to be reduced, and if the capacitance is to be increased. Further, in using the trench, the depth of the trench is modified in order to reduce the current leakage due to the punch-through.

Therefore, it is an object of the present invention to provide a DRAM cell and a formation process thereof, in which a mixed stacked trenched capacitor is embodied.

It is another object of the present invention to provide a capacitor structure having a storage capacitance sufficient to be applied to an ultra large scale integrated circuit (ULSI).

In achieving the above objects, according to one aspect of the present invention, a dynamic random access memory cell is provided having a single transistor and a single capacitor, and is characterized in that: the capacitor comprises a trenched capacitor, and stacked capacitor having a vertical relation to the trenched capacitor and formed on the position of the transistor; the depth of the trench of the trenched capacitor is designed to be different from the depth of the trenched capacitor of the adjacent memory cell; and the area of the stacked capacitor of the first memory cell having a shallow trenched capacitor is designed to be larger than the area of the electrode of the stacked capacitor of an adjacent second memory cell having deeper trenched capacitor.

According to another aspect of the present invention, a formation process for the DRAM cell having a single transistor and a single capacitor and having mixed trenched and stacked structure, comprises: step of forming a first trench of a required depth using a first mash when forming the trenched capacitor; step of forming a second trench having a deeper trench relative to the first trench using a second mask; and step of forming a stacked capacitor.

In the step of forming the stacked capacitor, the area of a first storage electrode of the first memory cell stacked capacitor having the first trenched capacitor is designed to be larger than the area of a second storage electrode of the second memory cell stacked capacitor having the second trenched capacitor.

DESCRIPTION OF THE PREFERRED EMBODIMENT

FIGS. 1A to 1I are sectional views showing the formation process for the DRAM cell having the MIST type capacitor according to the present invention.

Figure 1A:
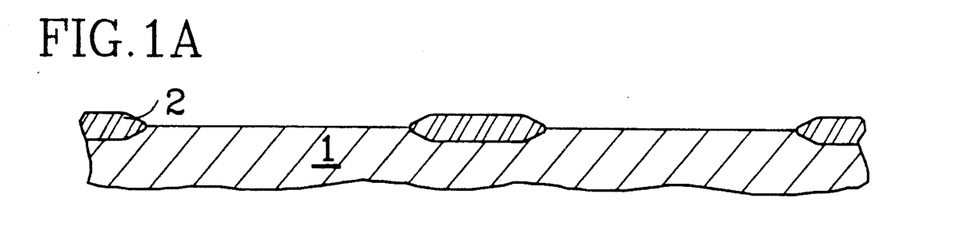
FIG. 1A–FIG. 1J are schematic vertical elevational views, partly in section, showing the formation process of the invention, in particular, a DRAM cell having a MIST type capacitor according to an embodiment of the present invention.

FIG. 1A illustrates a step of defining an active region and an inactive region, and this step is carried out by growing a field oxide layer 2 on a P type silicon substrate by applying the ordinary method.

FIG. 1A illustrates the step of defining an active region and an inactive region conventionally carried out by growing a full oxide layer 2 on a P-type silicon substrate.

Figure 1B:
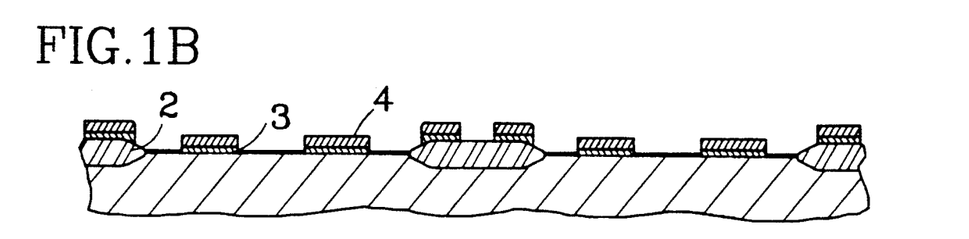

FIG. 1B illustrates a step in which a gate insulating layer 3 is formed by applying a thermal oxidation method, and then, polysilicon is spread in the thickness of 2000 Å. Then a patterning is carried out in such a manner that two memory cells should be assigned per active region, thereby forming two gate electrodes 4, the rest of the portion being removed thereafter.

Figure 1C:
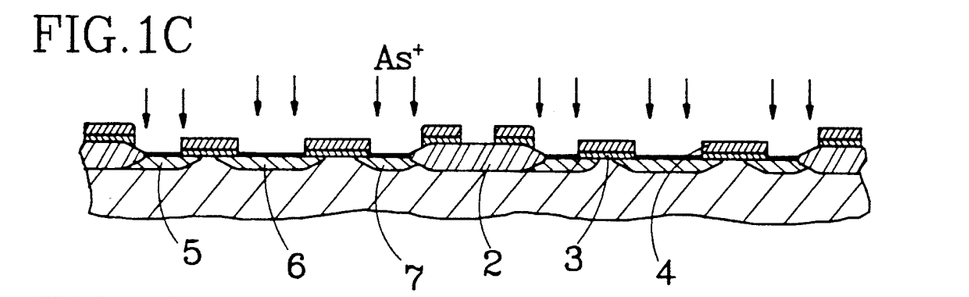

Then, as shown in FIG. 1C, a first memory cell source region 5, a common drain region 6 and a second memory cell source region 7 are formed, in such a manner that an arsenic ion implantation in the rate of $5 \times 10^{15}$ atoms/cm$^2$ with an energy of 40 KeV is carried out, thereby forming the sources and the common drain.

Figure 1D:
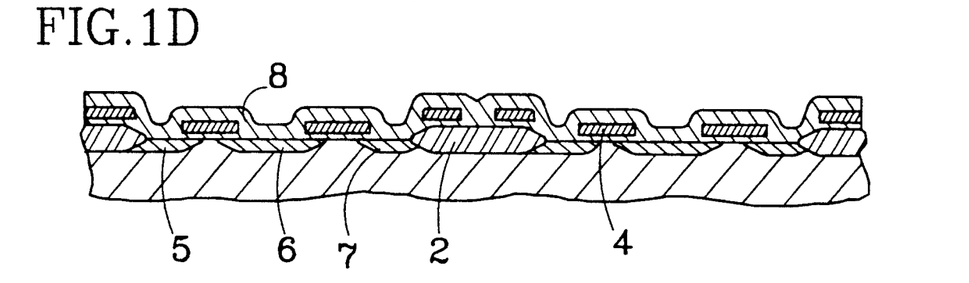

FIG. 1D illustrates a step of spreading a first insulating layer 8 upon the structure obtained through the step of FIG. 1C, and in this step, $SiO_2$ is spread in the thickness of 1000 Å and in the form of an HTO (high temperature oxidation) layer.

Figure 1E:
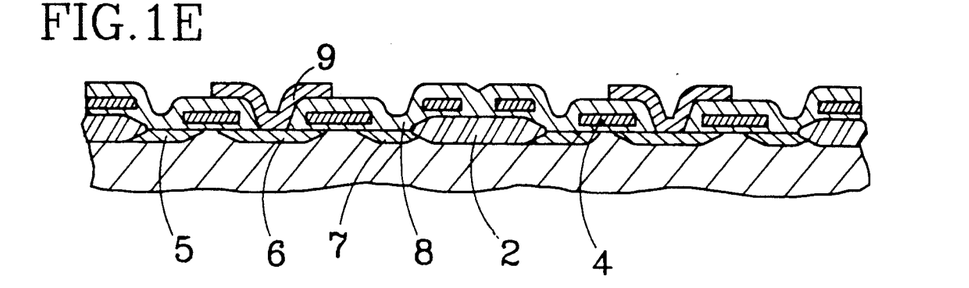

FIG. 1E illustrates a step of forming a bit line 9, and the bit line 9 is formed by spreading polysilicon in the thickness of 500 Å, and by carrying out a patterning.

Figure 1F:
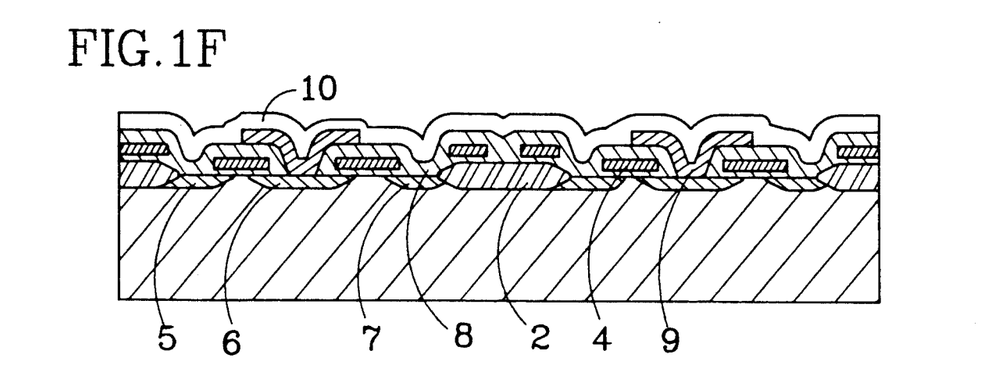

FIG. 1F illustrates a step of forming a second insulating layer 10 on the structure obtained through the step of FIG. 1E, and the layer 10 is formed in the thickness of 2000 Å and in the form of an HTO layer.

Figure 1G:
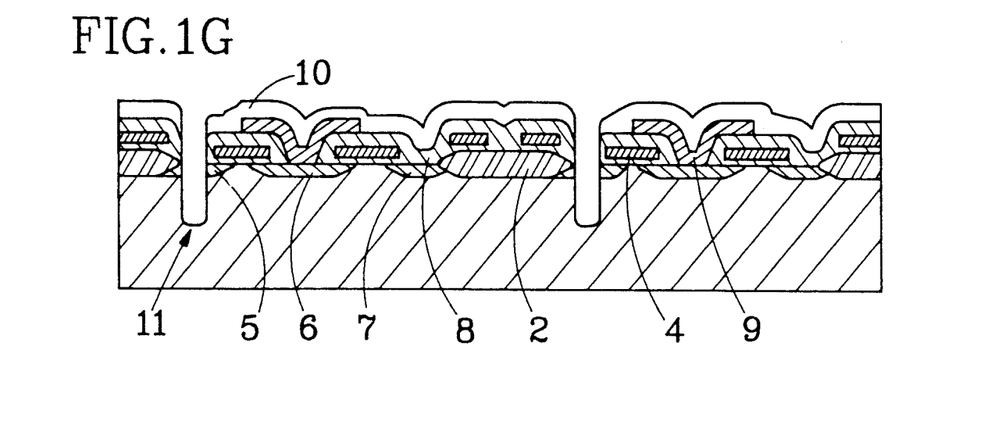

FIG. 1G illustrates a step of forming a first trench 11 having shallow depth. Specifically, an exposing development is carried out using a first trench mask in order to form a trench through the source region 5 of the left first memory cell among the two memory cells disposed on the first active region. Before carrying out the exposing development, a photoresist is spread on the surface of the second insulating layer 10. Thereafter, a reactive ion etching (RIE) is carried out to form a second insulating layer 10, a first insulating layer 8 and a gate insulating layer 3, in such a manner that insulating layer surrounding the gate 4 should not be etched. Succeedingly, the same kind of etching is carried out, that is, the source region 5 and the P type silicon substrate 1 are etched to form a first trench 11, the photoresist remaining on the substrate being removed thereupon.

Figure 1H:
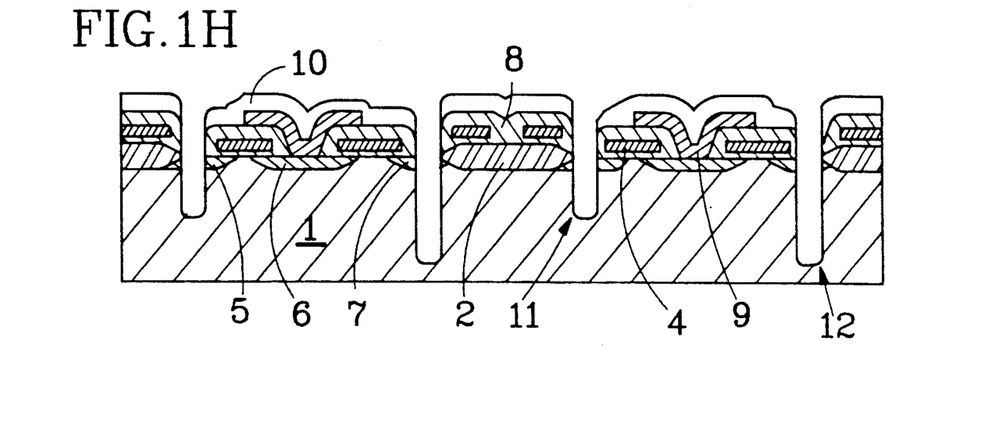

FIG. 1H illustrates a step of forming a second trench 12, and this step is carried out in the same manner as that of FIG. 1G, except that a second trench mask is used so as for the trench to be formed only through the source region 7 of the right second memory cell, and except that the etching time is controlled so as for the depth of the second trench 12 to be deeper than that of the first trench 11.

The trench forming steps of FIGS. 1G and 1H can be finished in a single process by forming in advance the step difference on the portion where the trench is to be formed.

Figure 1I:
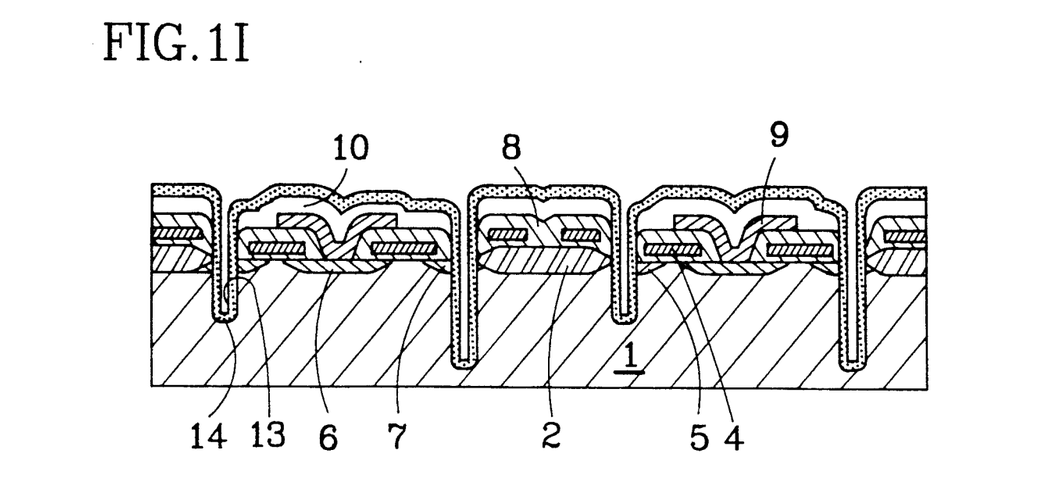

FIG. 1I illustrates a step of forming a first electrode of the capacitor, and this step is carried out in such a manner that: an insulating layer 13 consisting of a silicon oxide layer is formed on the inside of the trenches 11, 12 formed through the step of FIG. 1H; a polysilicon layer 14 to be served as the first electrode of the capacitor is spread by applying a CVD method; and then, a first electrode material is formed by dipping the obtained device into $POCl_3$ to diffuse phophorus or implanting a phosphorus or arsenic ion into the polysilicon layer 14.

Figure 1J:
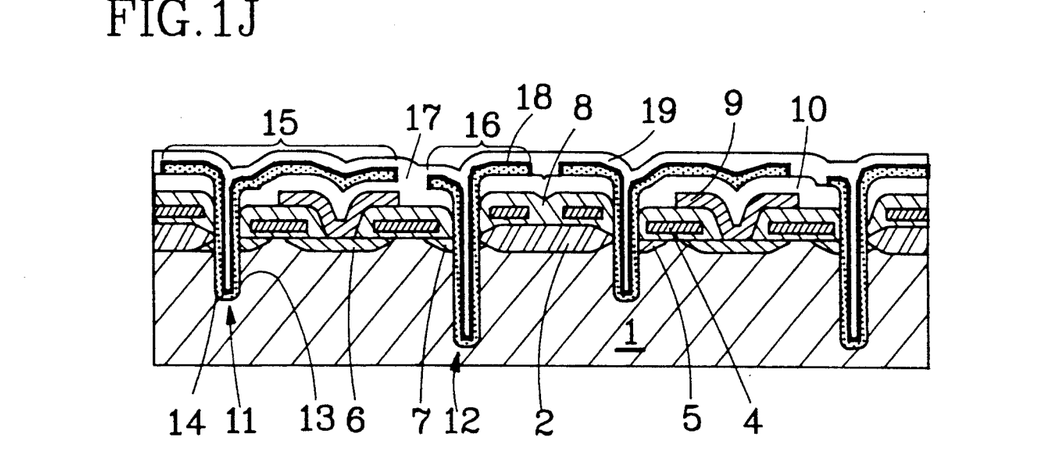

FIG. 1J illustrates a step of forming a stacked storage electrode, and this step is carried out in such a manner that: the right portion of a storage electrode 15 of the stacked capacitor is let to extend in an elongate form up to the upper portion of the gate electrode 3 of the second memory cell in order to compensate the insufficient storage capacitance of the first memory cell having a shallow trench depth; and, for the second memory cell having a sufficient trench depth, the polysilicon layer 14 is patterned in such a manner as to form the left portion of a storage electrode 16 of the stacked capacitor in a short form, thereby forming a contact opening 17, and separating the storage electrodes.

Thereafter, an insulating layer 18 made of dielectric substance having high dielectric constant and comprising $SiO_2$ or $SiO_2$, $Si_3N_4$ and $SiO_2$ (so called ONO) films is formed on the first electrode. On the whole surface of the structure including the insulating layer 18, there is grown a polysilicon layer 19 to be served as the second electrode, and it is dipped into $POCl_3$ to diffuse phosphorus, thereby forming a second electrode material.

The DRAM cell having the mixed stacked and trenched capacitor according to the present invention is manufactured through the process described above.

Figure 2:
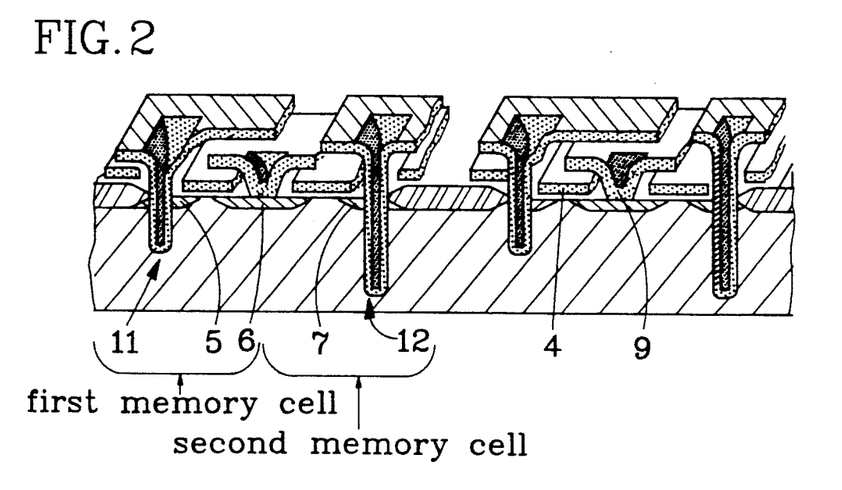
FIG. 2 is a schematic vertical elevational view, partly in section, showing the completed MIST type DRAM cell of the invention in which $SiO_2$ is removed.

A partly sectional perspective view showing a state in which the insulating layer is removed from the completed DRAM cell is illustrated in FIG. 2. As clearly can be seen in this drawing, the DRAM cell of the present invention is constituted such that the depths of the trenches of the adjacent memory cells are differently provided. Accordingly, the punch-through phenomenon liable to occur between the adjacent memory cells can be inhibited, and the capacitance of the capacitor having a shallower trench depth can be compensated relative to that of the capacitor having a deeper trench depth by means of a larger capacitor area. Further, in this case, the compensation of the capacitance is achieved without the existence of a step difference and an overlapping, and therefore, there occurs no coupling between adjacent storage electrodes.

What is claimed is:

1. A process for making a dynamic random access memory cell structure with at least two memory cells having a shallow first trenched capacitor and a deeper second trenched capacitor comprising:
   forming a shallow first trench using a first mask;
   forming a second trench deeper than said first shallow trench using a second mask;
   applying a conductive layer to serve as storage electrodes of the capacitors onto said first and second trenches so that a portion of the conductive layer is on each of the first and second trenches and covering said conductive layer with a third mask; and
   etching said conductive layer to form the storage electrodes, wherein the storage electrode on the shallow trench having a larger surface area than the storage electrode on the deep trench.

2. A process according to claim 1 further comprising forming said structure with at least two adjacent memory cells with a capacitor, the area of the storage electrode of said capacitor of one memory cell having the shallow first trenched capacitor being larger than the area of the second storage electrode of said capacitor of an adjacent memory cell having the deeper second trenched capacitor.

3. A process according to claim 2 wherein an area including two adjacent memory cells comprises an active region.

4. A process according to claim 3 wherein said first and second trenches are formed in a single etching step by providing a structure with trenches of difference depth in advance on the portion of the active region.

* * * * *

UNITED STATES PATENT AND TRADEMARK OFFICE
CERTIFICATE OF CORRECTION

PATENT NO. : 5,196,363

DATED : March 23, 1993

INVENTOR(S) : Youngtae Kang; Laeku Kang

It is certified that error appears in the above-indentified patent and that said Letters Patent is hereby corrected as shown below:

On title page, item [57]:

Abstract, line 3, change "thereof" to -- therefore --.

Abstract, lines 3,4, delete "According to the present invention," and change "the" to -- The --.

Abstract, line 6, change "Further, the" to -- The --.

Abstract, line 15, before "ultra" insert -- an --.

Column 1, line 15, before "semiconductor" delete "the".
Column 1, line 20, change "Thus, it is" to -- It is therefore --.
Column 1, line 28, change "and reducing" to -- so as to reduce --.
Column 1, line 32, change "proposed, and this" to -- proposed. This --.
Column 1, line 37, after "1985)" insert -- (International Electron Devices Meeting) --.
Column 1, line 38, before "trench" change "This" to -- The --.
Column 1, line 40, change "manner. That is," to -- manner: --.
Column 1, line 43, after "well, and" delete "an".
Column 1, line 44, change "while" to -- and --.
Column 1, line 49, change ", and" to -- and, --.
Column 1, line 57, change "Further" to -- In addition --.

UNITED STATES PATENT AND TRADEMARK OFFICE
CERTIFICATE OF CORRECTION

PATENT NO. : 5,196,363
DATED : March 23, 1993
INVENTOR(S) : Youngtae Kang; Laeku Kang It is certified that error appears in the above-indentified patent and that said Letters Patent is hereby corrected as shown below:

```
Column 1, line 64, before "proposed" change "is" to
          -- has been --.
Column 1, lines 64,65, change ", and this technique" to
          -- which --.

Column 2, line 3, before "conventional" delete "above".
Column 2, line 3, change "will be further" to
          -- mentioned previously are --.
Column 2, line 4, change "referring to" to -- in --.
Column 2, line 8, change "code" to -- numeral --.
Column 2, line 8, after "22" insert -- is --.
Column 2, line 9, before "a field" insert -- is --.
Column 2, line 19, after "reference" change "code" to
          -- numeral --.
Column 2, line 21, after "32" insert -- is --.
Column 2, line 21, after "33" insert -- is --.
Column 2, line 22, after "34" insert -- is --.
Column 2, line 22, after "35" insert -- is --.
Column 2, line 23, after "36 and 37" insert -- are --.
Column 2, line 24, after "38 and 39" insert -- are --.
Column 2, line 24, after "40" insert -- is --.
Column 2, line 29, change "layer" to -- layers --.
Column 2, line 29, delete "and another field oxide
          layer 40".
Column 2, line 38, change "Accordingly" to
          -- In this arrangement --.
Column 2, line 42, change "close" to -- short --.
Column 2, line 43, after "electrodes" insert
          -- to become --.
Column 2, line 51, after "phenomenon" delete "respectively".
```

UNITED STATES PATENT AND TRADEMARK OFFICE
CERTIFICATE OF CORRECTION

PATENT NO. : 5,196,363
DATED : March 23, 1993
INVENTOR(S) : Youngtae Kang; Laeku Kang It is certified that error appears in the above-indentified patent and that said Letters Patent is hereby corrected as shown below:

```
Column 2, lines 52,53, after "capacitor" insert
          -- , respectively --.
Column 2, line 64, change "thereof" to -- therefore --.
Column 2, line 65, before "which" delete "in".
Column 2, line 65, after "which" insert -- embodies --.
Column 2, lines 65,66, after "capacitor" delete
          "is embodied".

Column 3, lines 9,10, change "transistor; the" to
          -- transistor.  The --.
Column 3, line 12, after "memory cell" delete the semicolon.
Column 3, line 13, change "having" to -- has --.
Column 3, line 14, after "capacitor" insert -- which --.
Column 3, line 16, after "having" insert -- a --.
Column 3, line 19, after "process" insert
          -- is provided --.
Column 3, line 21, after "structure," insert -- which --.
Column 3, line 21, after "comprises:" delete "step of".
Column 3, line 22, after "first" change "mash" to
          -- mask --.
Column 3, lines 23,25, delete "step of" (both occurrences).
Column 3, lines 49,50, change "DESCRIPTION OF THE PREFERRED
          EMBODIMENT" to -- DESCRIPTION OF PREFERRED
          EMBODIMENTS --.
```

UNITED STATES PATENT AND TRADEMARK OFFICE
CERTIFICATE OF CORRECTION

PATENT NO. : 5,196,363
DATED : March 23, 1993
INVENTOR(S) : Youngtae Kang; Laeku Kang It is certified that error appears in the above-indentified patent and that said Letters Patent is hereby corrected as shown below:

Column 3, lines 51-57, delete lines 51-57, "FIGS. 1A to 1I . . . ordinary method." and insert therefor -- The objects and advantages of the present invention will become more apparent by the following description of the preferred embodiments of the present invention with the reference to the accompanying drawings in which is shown in FIG. 1A a field oxide layer 2 of a P type silicon substrate by applying the ordinary method. --.

Column 3, line 64, after "spread" insert
-- (i.e., deposited) --.
Column 3, line 65, before "a patterning" change "Then" to
-- Thereafter --.
Column 3, line 68, after "being" insert
-- subsequently --.
Column 3, line 68, after "removed" delete "thereafter".

Column 4, line 6, change ", thereby forming" to
-- to form --.
Column 4, lines 13,14, before "by spreading" delete ", and the bit line 9 is formed".
Column 4, line 18, change ", and the" to -- . The --.
Column 4, lines 21,22, change "an exposing development is carried out" to -- a first exposure is made --.
Column 4, lines 25,26, change "exposing development" to
-- first exposure --.
Column 4, line 26, after "photoresist" insert -- layer --.

UNITED STATES PATENT AND TRADEMARK OFFICE
CERTIFICATE OF CORRECTION

PATENT NO. : 5,196,363
DATED : March 23, 1993
INVENTOR(S) : Youngtae Kang; Laeku Kang It is certified that error appears in the above-indentified patent and that said Letters Patent is hereby corrected as shown below:

Column 4, line 28, change "to form" to -- to etch --.
Column 4, line 31, change "should not be etched" to -- is not etched --.
Column 4, lines 31,32, change "Succeedingly, the" to -- The --.
Column 4, line 32, before "carried" insert -- successively --.
Column 4, line 35, change "thereupon" to -- therefrom --.
Column 4, line 39, change "as for" to -- so that --.
Column 4, line 39, change "to be" to -- is --.
Column 4, line 41, change "as for" to -- that --.
Column 4, line 42, change "to be" to -- is --.
Column 4, line 49, change ", and this" to -- . This --.
Column 4, line 50, after "that" delete the colon.
Column 4, line 52, change "11,12" to -- 11 and 12: --.
Column 4, line 53, change "be served" to -- serve --.
Column 4, line 54, change "spread by applying" to -- deposited by --.
Column 4, line 57, change "implanting" to -- implant --.
Column 4, line 61, after "that" delete the colon.
Column 4, line 62, change "let" to -- allowed --.
Column 4, line 64, after "compensate" insert -- for --.
Column 4, line 66, change "for" to -- so that --.
Column 4, line 67, change "having" to -- has --.

Column 5, line 3, change "separating" to -- to separate --.
Column 5, line 9, change "to be served" to -- to serve --.
Column 5, line 10, before "dipped" delete "it is".

UNITED STATES PATENT AND TRADEMARK OFFICE
CERTIFICATE OF CORRECTION

PATENT NO. : 5,196,363
DATED : March 23, 1993
INVENTOR(S) : Youngtae Kang; Laeku Kang It is certified that error appears in the above-indentified patent and that said Letters Patent is hereby corrected as shown below:

Column 5, line 14, after "trenched" change "capacitor" to
-- capacitors --.
Column 5, lines 18,19, change "As clearly can be seen" to
-- As can be clearly seen --.
Column 5, lines 21,22, change "differently provided" to
-- different --.
Column 5, lines 22,23, after "phenomenon" insert
-- which is --.
Column 5, line 30, change "an overlapping, and therefore,
there occurs" to -- overlapping; therefore --.
Column 5, line 30, after "electrodes" insert -- occurs --.

In the Claims:

Column 6, line 30, after "trenches of" change "difference" to -- different --.

Signed and Sealed this

Third Day of May, 1994

Attest:

BRUCE LEHMAN

Attesting Officer

Commissioner of Patents and Trademarks